(12) United States Patent
Hekmat et al.

(10) Patent No.: US 9,275,784 B2
(45) Date of Patent: Mar. 1, 2016

(54) ELECTRONIC CIRCUITS USING COUPLED MULTI-INDUCTORS

(75) Inventors: Mohammad Hekmat, Mountain View, CA (US); Farshid Aryanfar, Allen, TX (US); Kambiz Kaviani, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 8 days.

(21) Appl. No.: 14/346,299

(22) PCT Filed: Aug. 29, 2012

(86) PCT No.: PCT/US2012/052872
§ 371 (c)(1),
(2), (4) Date: Mar. 20, 2014

(87) PCT Pub. No.: WO2013/043334
PCT Pub. Date: Mar. 28, 2013

(65) Prior Publication Data
US 2014/0218120 A1    Aug. 7, 2014

Related U.S. Application Data

(60) Provisional application No. 61/538,307, filed on Sep. 23, 2011.

(51) Int. Cl.
| | | |
|---|---|---|
| H03B 5/12 | (2006.01) | |
| H01F 27/00 | (2006.01) | |
| H03B 27/00 | (2006.01) | |
| H03K 5/24 | (2006.01) | |

(52) U.S. Cl.
CPC ............ *H01F 27/006* (2013.01); *H03B 5/1215* (2013.01); *H03B 5/1228* (2013.01); *H03B 27/00* (2013.01); *H03K 5/24* (2013.01)

(58) Field of Classification Search
CPC ............................ H01F 27/006; H03B 5/1228
USPC ........... 331/36 L, 45, 74, 116 R, 116 FE, 167
See application file for complete search history.

(56) References Cited

U.S. PATENT DOCUMENTS

| | | |
|---|---|---|
| 6,791,423 B2 | 9/2004 | Leenaerts et al. |
| 6,911,870 B2 | 6/2005 | Gierkink et al. |
| 7,154,349 B2 | 12/2006 | Cabanillas |
| 7,295,076 B2 | 11/2007 | Kim et al. |

(Continued)

FOREIGN PATENT DOCUMENTS

EP    2273613 A1    1/2011

OTHER PUBLICATIONS

PCT International Search Report and Written Opinion, PCT/US2012/052872, Mar. 4, 2013, 12 Pages.
Decanis et al., "A mm-Wave Quadrature VCO Based on Magnetically Coupled Resonators," 2011 IEEE International Solid-State Circuits Confrerence 16.2. 3 pages.

(Continued)

*Primary Examiner* — Jeffrey Shin
(74) *Attorney, Agent, or Firm* — Fenwick & West LLP

(57) ABSTRACT

Coupled multi-inductors and their applications. An apparatus includes several circuit stages. Each circuit stage includes an inductive element that overlaps with the inductive elements of its adjacent circuit stages, forming a loop of coupled circuit stages. The apparatus may be, for example, a multi-phase oscillator with multiple oscillators that are magnetically coupled to each other for generating oscillation signals at different phases. The apparatus may also be, for example, a phase interpolator for combining input signals.

18 Claims, 12 Drawing Sheets

(56) References Cited

U.S. PATENT DOCUMENTS

| | | |
|---|---|---|
| 7,411,468 B2 | 8/2008 | Luong et al. |
| 7,432,794 B2 | 10/2008 | Mattsson |
| 7,511,588 B2 | 3/2009 | Gabara |
| 7,649,424 B2 | 1/2010 | Cusmai et al. |
| 7,915,960 B2 | 3/2011 | Kee et al. |
| 2006/0033584 A1* | 2/2006 | Fujimoto et al. ............ 331/36 L |
| 2011/0006872 A1 | 1/2011 | Nazarian et al. |

OTHER PUBLICATIONS

Ng et al., "A 1-V 17-GHZ 5-mW CMOS Quadrature VCO Based on Transformer Coupling," IEEE Journal of Solid-State Circuits, vol. 42, No. 9 Sep. 2007. 9 pages.

PCT International Preliminary Report on Patentability dated Apr. 3, 2014 (Chapter I) in International Application No. PCT/US2012/052872. 8 pages.

\* cited by examiner

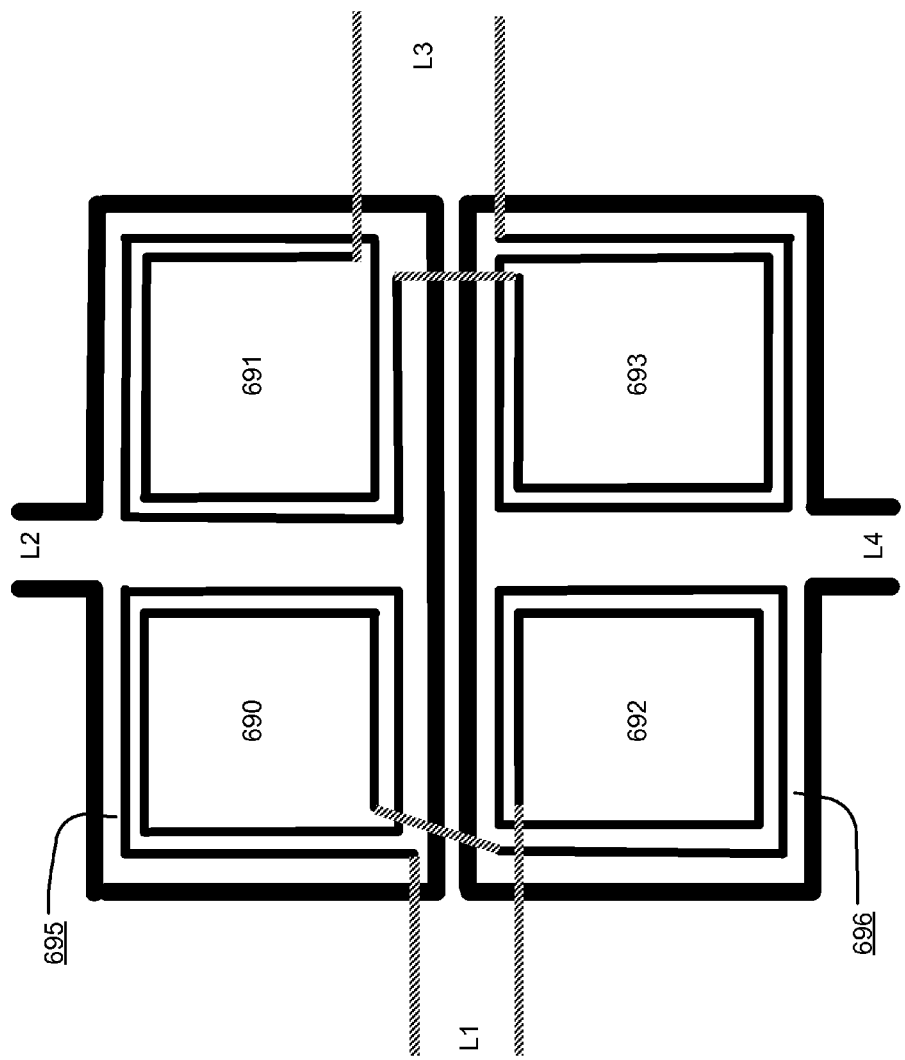

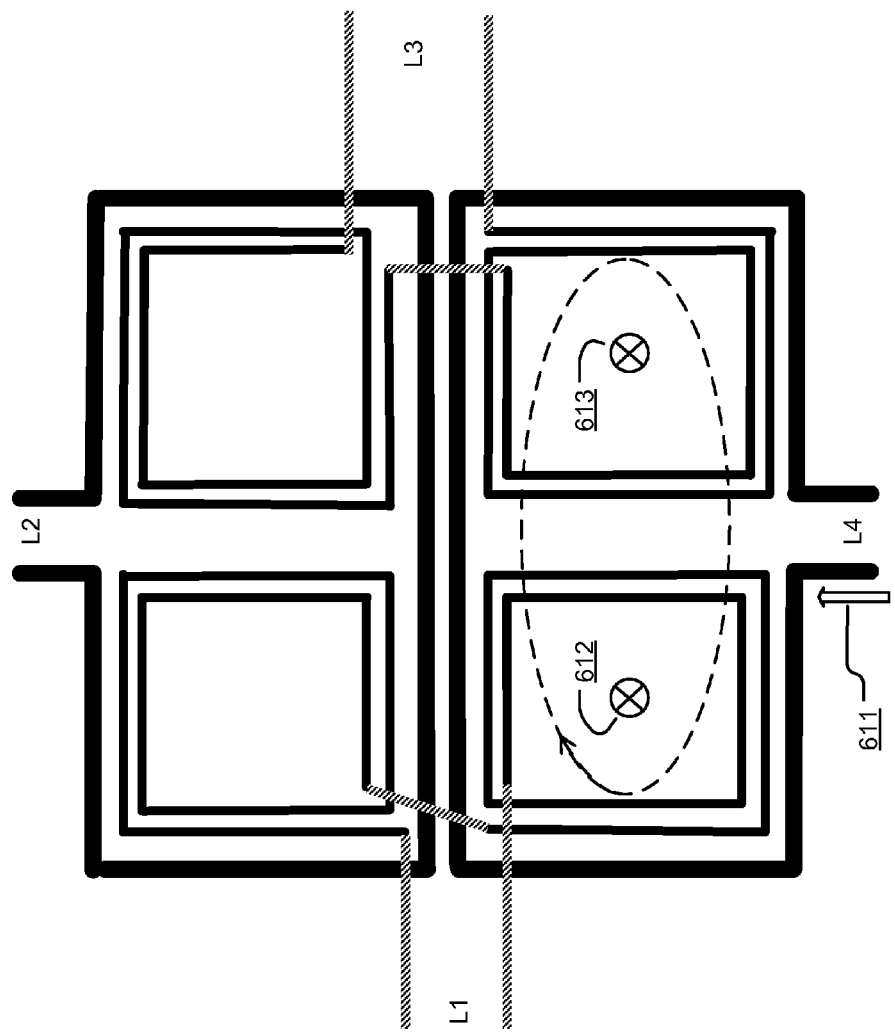

ELECTRONIC CIRCUITS USING COUPLED MULTI-INDUCTORS

BACKGROUND

The present disclosure relates to coupled multi-inductors and their applications.

Multiphase clocking schemes are ubiquitous in radio frequency and high speed systems. In systems that use multi-phase clocking, multiple clock signals are generated such that each clock signal has a predictable relative phase offset from the other clock signals. Multiple clock signals with certain phase relations can be generated by multiple oscillators. One type of multi-phase clocking is quadrature clocking in which the clock signals are ninety degrees out-of-phase with each other. Improving the frequency and phase accuracy as well as the stability of such signals can be important for increasing system performance and efficiency

BRIEF DESCRIPTION OF THE DRAWINGS

The teachings of the embodiments herein can be readily understood by considering the following detailed description in conjunction with the accompanying drawings.

FIGS. 6A, 6B, 6C, 6D and 6E illustrates a structure of magnetically-coupled inductors for the oscillators of FIG. 4, according to an embodiment.

DETAILED DESCRIPTION OF EMBODIMENTS

Embodiments of the present disclosure relate to coupled multi-inductors and their applications. In one embodiment, an apparatus includes several circuit stages. Each circuit stage includes an inductive element that overlaps with the inductive elements of its adjacent circuit stages, forming a loop of coupled circuit stages. The overlaps between the inductive elements enable energy to be transferred between the circuit stages via inductive coupling. Most pairs of the inductive elements may induce the same energy in each other, except for one pair of inductive elements that is inverted from the rest of the pairs in the loop. In one particular embodiment, the apparatus is a multi-phase oscillator that includes the disclosed configuration of magnetically coupled multi-inductors. By using the magnetically coupled inductors in a multi-phase oscillator, the multi-phase oscillator may have a reduced amount of jitter and a wide tuning range. Further, due to the overlapping configuration of the inductors, the total amount of area needed to implement the multi-phase oscillator may be reduced. In another embodiment, the apparatus is a phase interpolator that combines different input signals by using the disclosed configuration of coupled inductive elements.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1A:
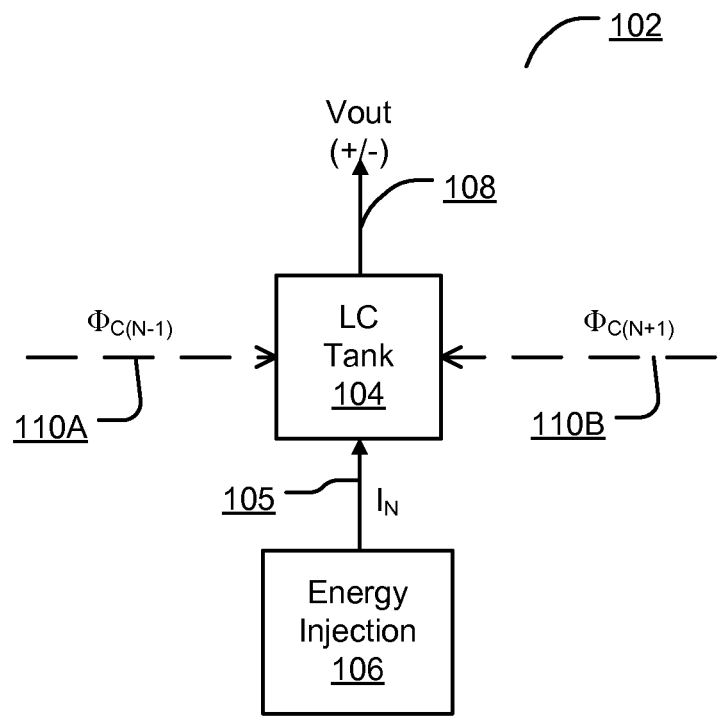
FIG. 1A illustrates a single stage of a magnetically-coupled oscillator in a loop of magnetically-coupled oscillators according to an embodiment.

FIG. 1A illustrates a single stage of a magnetically-coupled oscillator 108 in a loop of magnetically-coupled oscillators, according to an embodiment. The oscillator 102 includes an LC tank 104 for storing energy and an energy-injection component 106 for injecting energy into the LC tank 104. The LC 104 tank may include one or more capacitive elements and one or more inductive elements. The LC tank 104 may be configured to generate one or more output signals 108 that oscillate at a particular frequency and at a particular phase relative to the phase of other oscillators in the loop. The frequency of the output oscillation signal 108 of the LC tank 104 depends on characteristics of the LC tank (e.g., the inductance and capacitance of the tank). The phase of the output oscillation signal 108 generated by the LC tank 104 will depend on the phase of the collective energy injected into the LC tank.

Because the LC tank 104 typically includes some parasitic resistance that will reduce the energy of the tank and thereby dampen the oscillations of the LC tank 104 from an original energy supply, the energy injection component 106 is used to replenish the loss of energy due to the resistance of the LC tank to maintain oscillation in the LC tank 104. Energy injection component 106 may be considered a negative resistance element with respect to the parasitic resistance of the LC tank 104. The energy injection component 106 injects or supplies supplemental energy (e.g., current) 105 ($I_N$) into the LC tank 104 to compensate for the parasitic resistance of the LC tank's 104 elements. The energy injection component 106 may, for example, be implemented with one or more pairs of cross coupled transistors that are connected to an energy source (not shown in FIG. 1A).

To set the oscillation of the LC tank 104 to a desired phase relative to other oscillators, two or more magnetic fluxes 110A, 110B are generated (also shown as $\Phi_{C(N-1)}$ and $\Phi_{C(N+1)}$) to inject energy into the LC tank 104. The magnetic fluxes are generated as a result of magnetic coupling between the inductive elements of the LC tank 104 and inductive elements of LC tanks in other oscillators in the loop (not shown in FIG. 1A). For example, magnetic coupling between the inductors of the LC tank 104 and inductors of another oscillator can be achieved by overlapping the coils of different inductors to form a type of transformer. When a current passes through an inductor of the other oscillator, it generates a magnetic flux through the inductor of the LC tank 104, which in turn induces a current in the LC tank 140. The additional oscillators may be configured with the same circuit elements as discussed with respect to the oscillator 102 of FIG. 1.

Generally, the magnetic fluxes 110 and the negative resistance signal 105 will operate at a common frequency. However, the magnetic fluxes 110A, 110B have phases that are different or offset from each other and different or offset from the phase of the negative resistance signal 105. Moreover, the fluxes may be generated such that the degree of each of the phases of the fluxes cancel so that a total flux resulting from their combination will have a phase approximately equal to that of the phase of the negative resistance signal 105. In this sense, the combined phases of the fluxes 110A and 110B are balanced with respect to the phase of the internal energy of the oscillator.

Figure 1B:
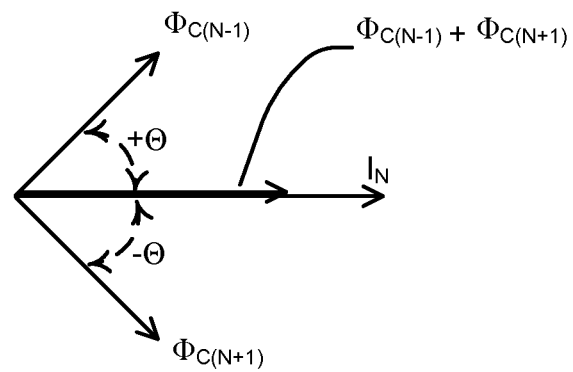
FIG. 1B illustrates a phase diagram of currents/magnetic flux at one of the output nodes of the oscillator of FIG. 1A, according to an embodiment.

Referring now to FIG. 1B, illustrated is a phase diagram of currents/magnetic flux at one of the output nodes of the oscillator of FIG. 1A, according to an embodiment. As illustrated, a first magnetic flux $\Phi_{C(N-1)}$ has a first phase of $+\Theta$. A second magnetic flux $\Phi_{C(N+1)}$ has a second phase of $-\Theta$. The phase of the first magnetic flux $\Phi_{C(N-1)}$ lags the phase of the negative resistance signal $I_N$ and the phase of the second magnetic flux $\Phi_{C(N+1)}$ leads the phase of the negative resistance signal. Thus, when the two fluxes are combined, the resultant flux (shown as $\Phi_{C(N-1)}+\Phi_{C(N+1)}$) has a phase that is substantially equal to the phase of the negative resistance signal $I_N$. When the fluxes are combined with the negative resistance signal $I_N$ for injecting the joint energy into the tank 104, they will generally be in phase with the internal energy of the LC tank 104.

Figure 2:
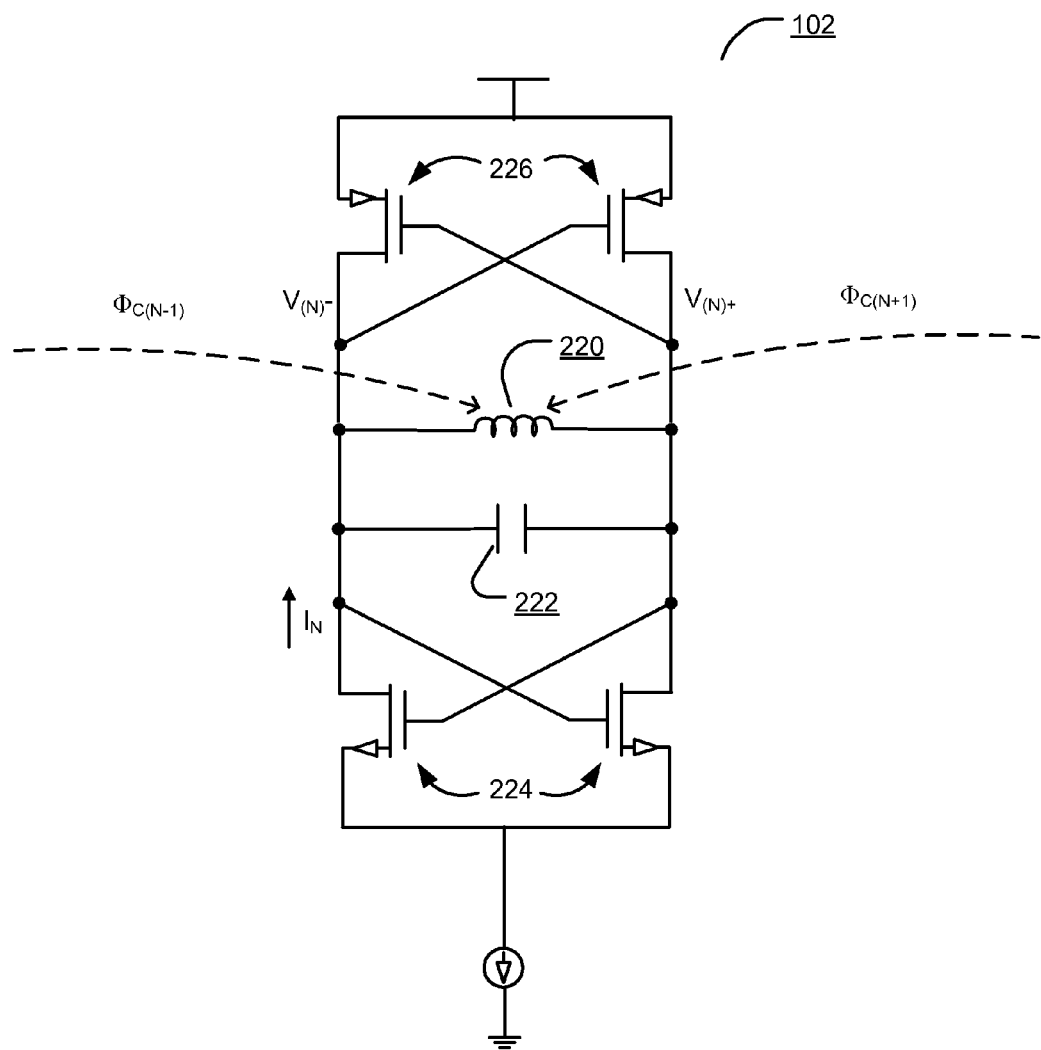
FIG. 2 is a circuit diagram further illustrating the oscillator of FIG. 1, according to an embodiment.

FIG. 2 illustrates an example circuit diagram for the oscillator 102 of FIG. 1, according to an embodiment. Inductor 220 and capacitor 222 form an LC tank, such as LC tank 104 of FIG. 1. The inductor 220 is magnetically coupled to inductors of at least two other oscillators (not shown in FIG. 2). A magnetic flux $\Phi_{C(N-1)}$ generated in the inductor 220 by the magnetic coupling injects energy into the LC tank. Another magnetic flux $\Phi_{C(N+1)}$ generated in the inductor 220 by the magnetic coupling also injects energy into the LC tank. Two cross coupled transistor pairs 224 and 226 form an energy injection component, such as energy injection component 106 of FIG. 1, to inject a negative resistance signal $I_N$ into the LC tank. Complementary versions of the output oscillation signal from the tank may be taken at points $V_{(N)-}$ or $V_{(N)+}$.

In other embodiments, other configurations of the LC tank and energy injecting component are possible. For example, the inductor 220 may be a center-tapped inductor that is connected to a supply voltage, and the energy injecting component may only include a single pair 224 of cross coupled transistors without the second pair 226 of cross coupled transistors.

Figure 3:
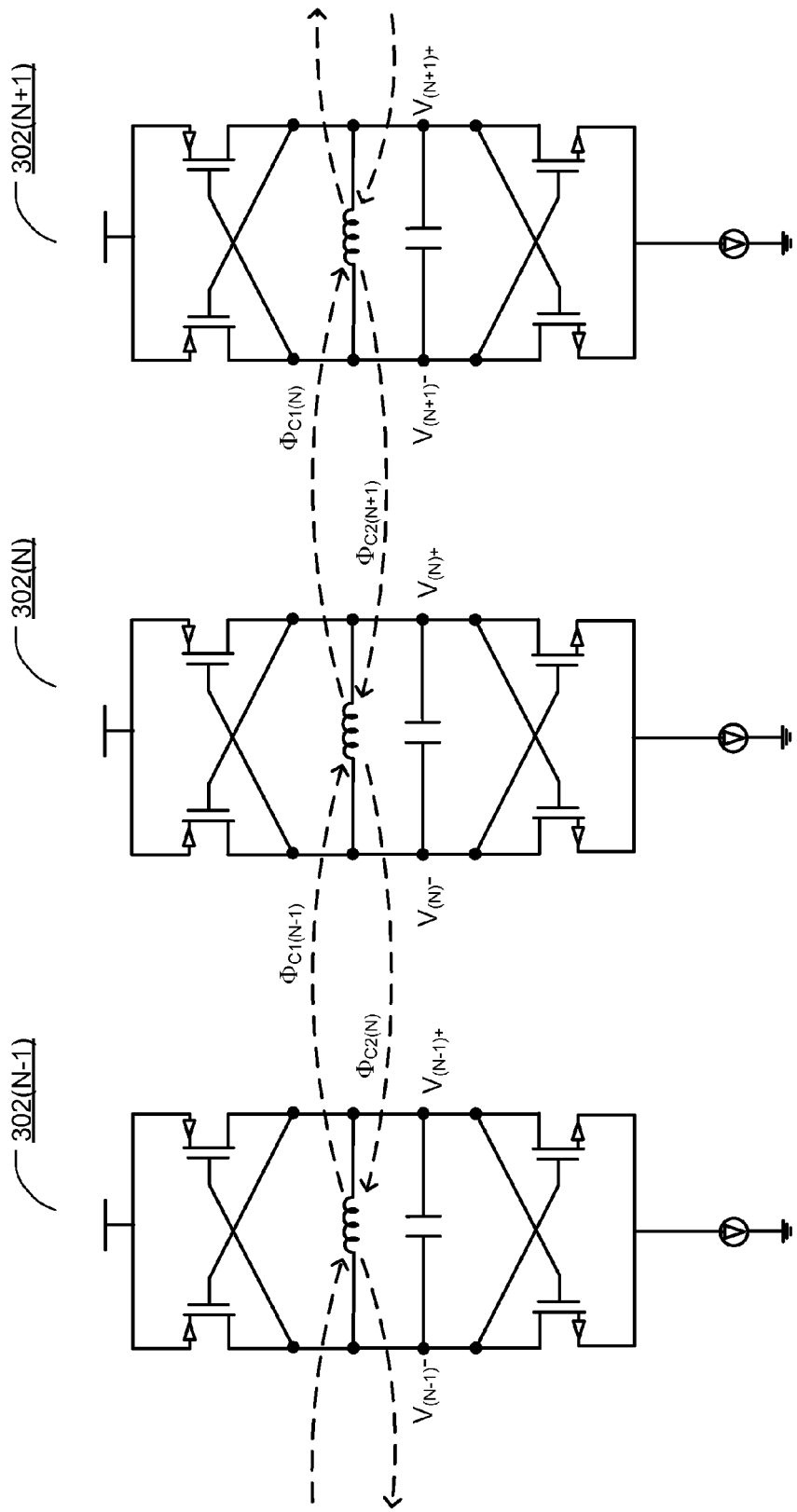
FIG. 3 illustrates magnetic coupling between several oscillators, according to an embodiment.

FIG. 3 illustrates magnetic coupling between several oscillators, according to an embodiment. Shown is an oscillator 302(N) that is magnetically coupled to additional oscillators 302(N+1) and 302(N-1). The components of each oscillator may be configured similarly and include components similar to those found in FIG. 2. As indicated by the dashed lines in FIG. 3, the inductor of oscillator 302(N) is magnetically coupled to both the inductor of oscillator 302(N+1) and the inductor of oscillator 302(N-1). The inductor of oscillator 302(N) generates a magnetic flux $\Phi_{C1(N)}$ in the inductor of oscillator 302(N+1) and a magnetic flux $\Phi_{C2(N)}$ in the inductor of oscillator 302(N-1). The inductor of oscillator 302(N+1) generates a magnetic flux $\Phi_{C2(N+1)}$ in the inductor of oscillator 302(N). The inductor of oscillator 302(N-1) generates a magnetic flux $\Phi_{C1(N-1)}$ in the inductor of oscillator 302(N). Oscillators 302(N-1) and 302(N+1) may be further magnetically coupled to other oscillators (not shown) in this manner.

A large number of oscillators may be magnetically coupled to each other in a loop in this manner. By coupling multiple oscillators in this way, multiphase output oscillation signals may be produced such that each N oscillator generates an output oscillation with a constant phase difference with a next N+1 oscillator by a degree that is a function of the number of oscillators coupled together. Advantageously, magnetically coupled multi-phase oscillators may have a reduced amount of jitter and a wider tuning range when compared to actively coupled multi-phase oscillators. For example, multi-phase oscillators that are actively coupled together through transistors have a high amount of noise due to the active devices, which adds to the jitter of the output oscillation signals. Additionally, the extra routing needed for the active coupling introduces a parasitic capacitance that decreases the tuning range of the oscillator. Thus, by obviating the need for active coupling, the jitter performance and tuning range of the multi-phase oscillator may be improved.

Figure 4:
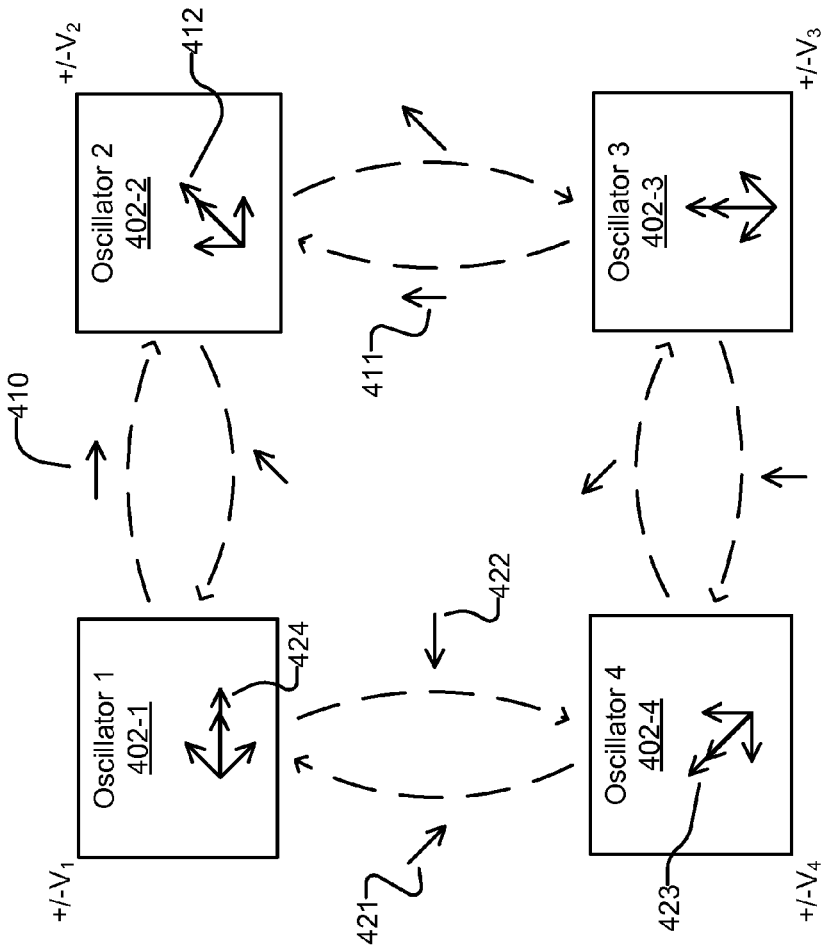
FIG. 4 illustrates a multi-phase oscillator with four magnetically-coupled oscillators, according to an embodiment.

FIG. 4 illustrates a multi-phase oscillator, in accordance with an embodiment. The arrangement includes four oscillators 402-1, 402-2, 402-3, and 404-4 for producing multi-phase clock signals. Each oscillator may be constructed as described in FIG. 1 and FIG. 2. Each oscillator is magnetically coupled to its neighboring oscillator to form a ring of oscillators. Thus, oscillator 402-1 is magnetically coupled to oscillator 402-2 and 402-4. Oscillator 402-2 is magnetically coupled to oscillator 402-1 and 402-3. Oscillator 402-3 is magnetically coupled to oscillator 402-2 and 402-4. Oscillator 402-4 is magnetically coupled to oscillator 402-1 and 402-3.

Each oscillator 402 is shown with a phase diagram (e.g., 412) that represents the energy injected into the oscillator 402 and the operating phase of the oscillator relative to other oscillators in the loop, which was previously explained in conjunction with FIG. 1B. The magnetic coupling between the oscillators 402 is labeled with arrows (e.g. 410, 411) that indicate the phase of the energy injected into an oscillator via magnetic coupling. The phase of an oscillator typically follows the aggregate phase of the energy that is injected into the oscillator. For example, oscillator 402-1 injects energy 410 via magnetic coupling into oscillator 402-2 that has the same phase as the oscillations 424 of oscillator 402-1. Oscillator 402-3 injects energy 411 into oscillator 402-2 via magnetic coupling that has the same phase as the internal energy of oscillator 402-3. The aggregate phase of the energy 410 and 411 injected via magnetic coupling into oscillator 402-2 sets the phase 412 of oscillator 402-2. Thus, the phase of each oscillator is effectively set according to the phases of the adjacent oscillators in the ring of oscillators. The same principles apply to each of the oscillators 402 of FIG. 4.

Generally speaking, the energy injected into an oscillator 402 via magnetic coupling is in phase with the oscillator providing the energy. However, with respect to the magnetic coupling between oscillators 402-1 and 402-4, the coupling is configured to create a 180 degree phase inversion around the loop of oscillators. Thus, in the case of a loop configuration of N oscillators, the magnetic coupling between the 1$^{st}$ oscillator and the Nth oscillator will be inverted from the coupling of the other oscillators. This permits a full rotation of the phases of the output oscillation signals between existing oscillators. For example, the energy 421 that is injected into oscillator 402-1 by oscillator 402-4 via magnetic coupling is reversed from the phase 423 of the oscillator 402-4 providing the energy. Similarly, the energy 422 that is injected into oscillator 402-4 by oscillator 402-1 via magnetic coupling is reversed from the phase 424 of the oscillator 402-1 providing the energy. In one embodiment, the in-phase and out-of phase magnetic coupling between the oscillators in FIG. 4 may be accomplished with the inductor configuration shown in FIGS. 6A, 6B, and 6C.

Each oscillator generates two output oscillation signals that are substantially opposite in phase to each other. Oscillator 402-1 generates output oscillation signals +/−$V_1$. Oscillator 402-2 generates output oscillation signals +/−$V_2$. Oscillator 402-3 generates output oscillation signals +/−$V_3$. Oscillator 402-4 generates output oscillation signals +/−$V_4$.

Figure 5:
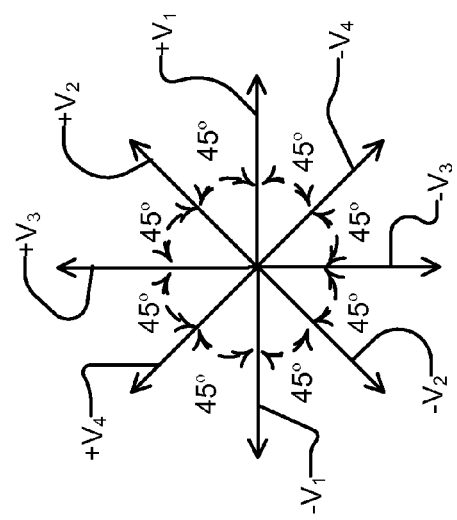
FIG. 5 illustrates the phase relationship of the output oscillation signals from the multiphase oscillator of FIG. 4, according to an embodiment.

FIG. 5 illustrates the phase relationship of the output oscillation signals from the multi-phase oscillator of FIG. 4. Due to the chosen number of oscillators and their coupling with each other, the output oscillation signals from each oscillator (shown as + or −Vn) are each forty five degrees out of phase with the signals of the immediately preceding oscillator. Output signal +$V_1$ is 45 degrees out of phase with output signal +$V_2$. Output signal +$V_2$ is 45 degrees out of phase with output signal +$V_3$. Output signal +$V_3$ is 45 degrees out of phase with output signal +$V_4$. Output signal +$V_4$ is 45 degrees out of phase with output signal −$V_1$. Output signal −$V_1$ is 45 degrees out of phase with output signal −$V_2$. Output signal −$V_2$ is 45 degrees out of phase with output signal −$V_3$. Output signal −$V_3$ is 45 degrees out of phase with output signal −$V_4$. Thus, this arrangement of oscillators with this production of output oscillation signal may be used to generate quadrature clock signals by taking the outputs of every other oscillator 402. Generally speaking, if there are N number of oscillators, the phase difference from the output of one oscillator to the output of the next oscillator is 180/N.

FIG. 6A illustrates a structure of magnetically coupled inductors for the oscillators of FIG. 4, according to one embodiment. As shown, the topology includes four different inductors: L1, L2, L3 and L4. In one embodiment, the inductors are manufactured in one or more metal layers in a semiconductor process. The solid lines represent metal in one metal layer (e.g., M1 layer), and the diagonally hatched lines represent metal in a different metal layer (e.g., M2 layer). The different metal layers may be connected by vias (not shown). As shown, both L1 and L3 are made from metal in two different metal layers. Both L2 and L4 are made from metal in a single metal layer. In other embodiments, the inductors may patterned on a printed circuit board or be discrete components that have overlapping coils.

In one embodiment, L1 represents the inductor in oscillator 402-1, L2 represents the inductor in oscillator 402-2, L3 represents the inductor in oscillator 402-3, and L4 represents the inductor in oscillator 402-4. For purposes of showing the magnetic coupling among inductors with clarity, other components of the oscillators, such as capacitors and cross-coupled transistors, are omitted from FIG. 6A. L2 and L4 are each comprised of one large inductive coil. L1 and L3 are each comprised of several coils.

The coils of the various inductors overlap to create a loop of inductors. Each inductor overlaps with and is magnetically coupled to its adjacent inductors—both the next inductor in the loop and the previous inductor in the loop. In region 690, a portion of inductor L1 overlaps with a portion of inductor L2 to create magnetic coupling between inductor L1 and inductor L2. In region 691, another portion of inductor L2 overlaps with a portion of inductor L3 to create magnetic coupling between inductor L2 and inductor L3. In region 693, another portion of inductor L3 overlaps with a portion of inductor L4 to create magnetic coupling between inductor L3 and inductor L4. In region 692, another portion of inductor L4 overlaps with another portion of inductor L1 to create magnetic coupling between inductor L4 and inductor L1. The magnetic coupling between the inductors allows the current passing through one inductor to generate a magnetic flux that induces a current through another inductor. Additionally, by physically overlapping the inductors in this manner, the total amount of area that is occupied by the multi-phase oscillator is also reduced. For example, if the inductors were non-overlapping, they would occupy approximately twice as much area on an integrated circuit.

The coils of inductor L1 are not all oriented in the same direction. Some of the coils 695 of inductor L1 are forward coils that carry current in one direction. Some of the coils 696 of inductor L1 are reverse coils that are inverted from the forward coils 695 and carry the same current in the opposite circular direction from the forward coils. As a result, the magnetic coupling between inductors L4 and L1 is reversed from the magnetic coupling between inductors L4 and L3 to create a 180 degree phase shift around the ring of oscillators. The magnetic coupling is explained in greater detail by reference to FIG. 6B-6E.

In some embodiments, the inductors may have a fewer or greater number of coils than is shown in FIG. 6A. In other embodiments, the configuration of inductors may be directly opposite from that shown in FIG. 6A. For example, in FIG. 6A, only inductor L1 has forward and reverse coils. The same 180 degree phase shift can also be implemented by an inductive structure where L1 is composed of a single large coil and the remaining inductors (e.g., L2, L3, L4) have forward and reverse coils.

Figure 6B:
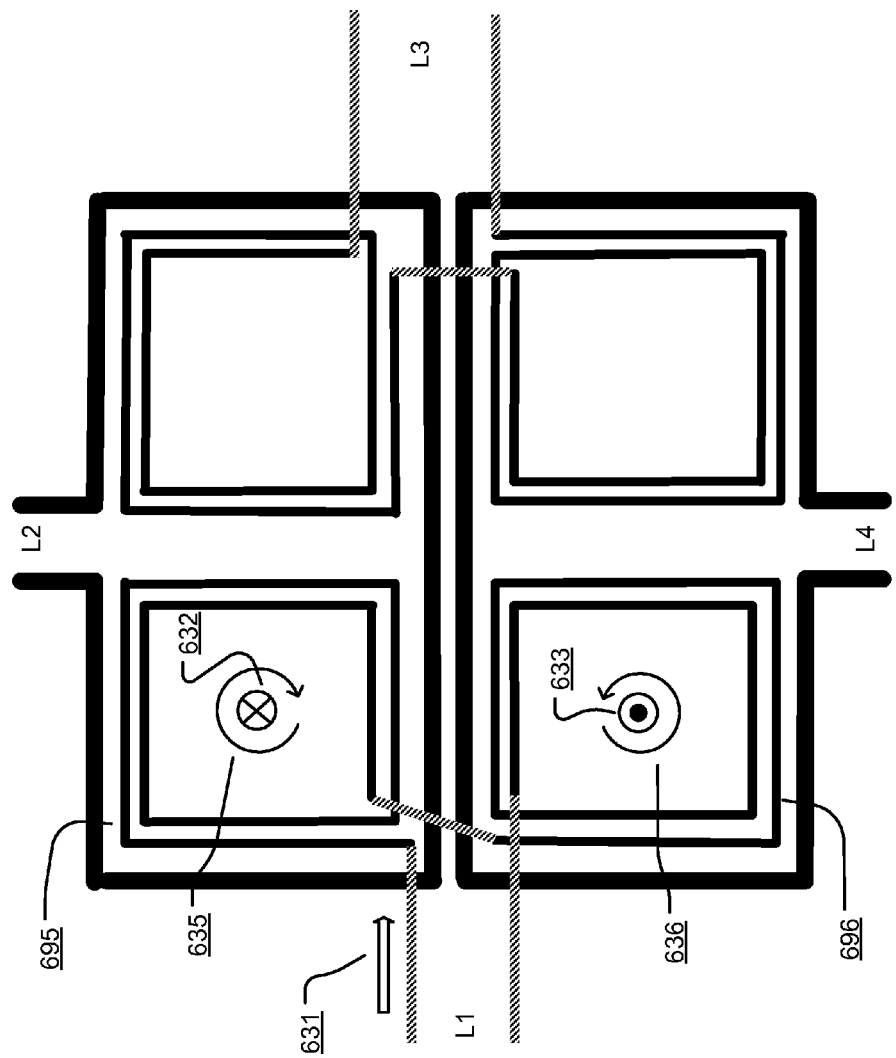

FIG. 6B illustrates the magnetic flux generated by inductor L1, according to an embodiment. Inductor L1 can be divided into forward coils 695 and reverse coils 696 that carry the same current 631 in opposite circular directions. When a current 631 flows through inductor L1, the current 631 flows in a clockwise direction 635 through the forward coils 695 and generates a magnetic flux 632 in one direction (i.e., into the page) for inductor pair L1-L2. The same current 631 flows in a counter-clockwise direction 636 through the reverse coils 696 and generates a magnetic flux 633 that is oriented in a substantially opposite direction (i.e., out of the page) for inductor pair L1-L4.

The layout of inductor L1 results in normal coupling between inductors L1 and L2 and reverse coupling between inductors L1 and L4. The reverse coupling between inductors L1 and L4 creates the 180 degree phase shift around the ring of oscillators that is depicted in FIG. 4. As the current 631 may be an AC current that switches directions over time, the flux directions shown in FIG. 6B represent the directions of the flux at a given instant in time when the current 631 is flowing in the indicated direction.

Figure 6C:
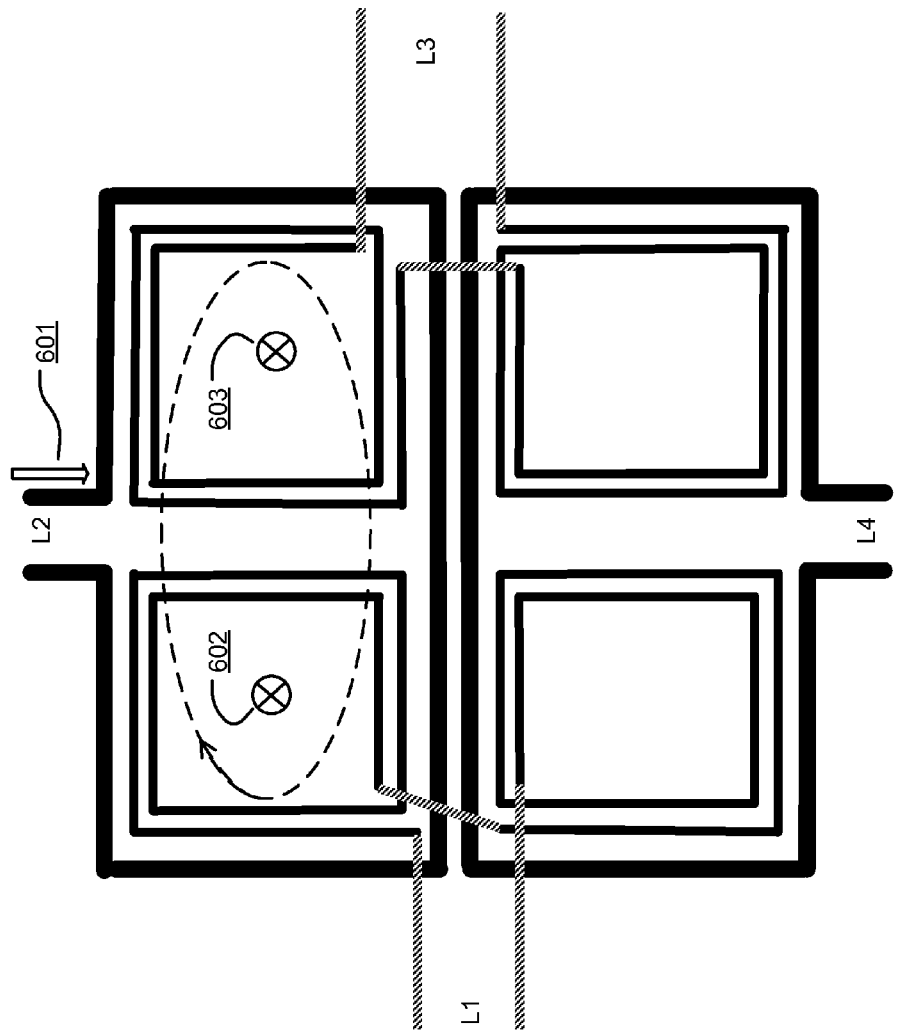

FIG. 6C illustrates the magnetic flux generated by inductor L2, according to an embodiment. For inductor L2, the flux lines generated in adjacent inductors L1 and L3 by a current 601 flowing through inductor L2 are oriented in a common direction. For example, when current 601 flows through inductor L2, it generates a magnetic flux 602 through a portion of inductor L1 and a magnetic flux 603 through a portion of inductor L3 at a given instance in time. Both magnetic fluxes 602 and 603 are oriented in a common direction (i.e., into the page). Fluxes 602 and 603 may further generate currents in L3 and L2 that induce into the page flux in the L3-L4 pair and out of the page flux in the L1-L4 pair (not shown).

FIG. 6D illustrates the magnetic flux generated by inductor L4, according to an embodiment. For inductor L4, the flux lines generated in adjacent inductors L1 and L3 by a current 601 flowing through inductor L4 are oriented in a common direction. For example, when a current 611 is flowing through inductor L4, it generates a magnetic flux 612 through a portion of inductor L1 and a magnetic flux 613 through a portion of inductor L3. Both magnetic fluxes are oriented in a common direction (i.e., into the page).

Figure 6E:
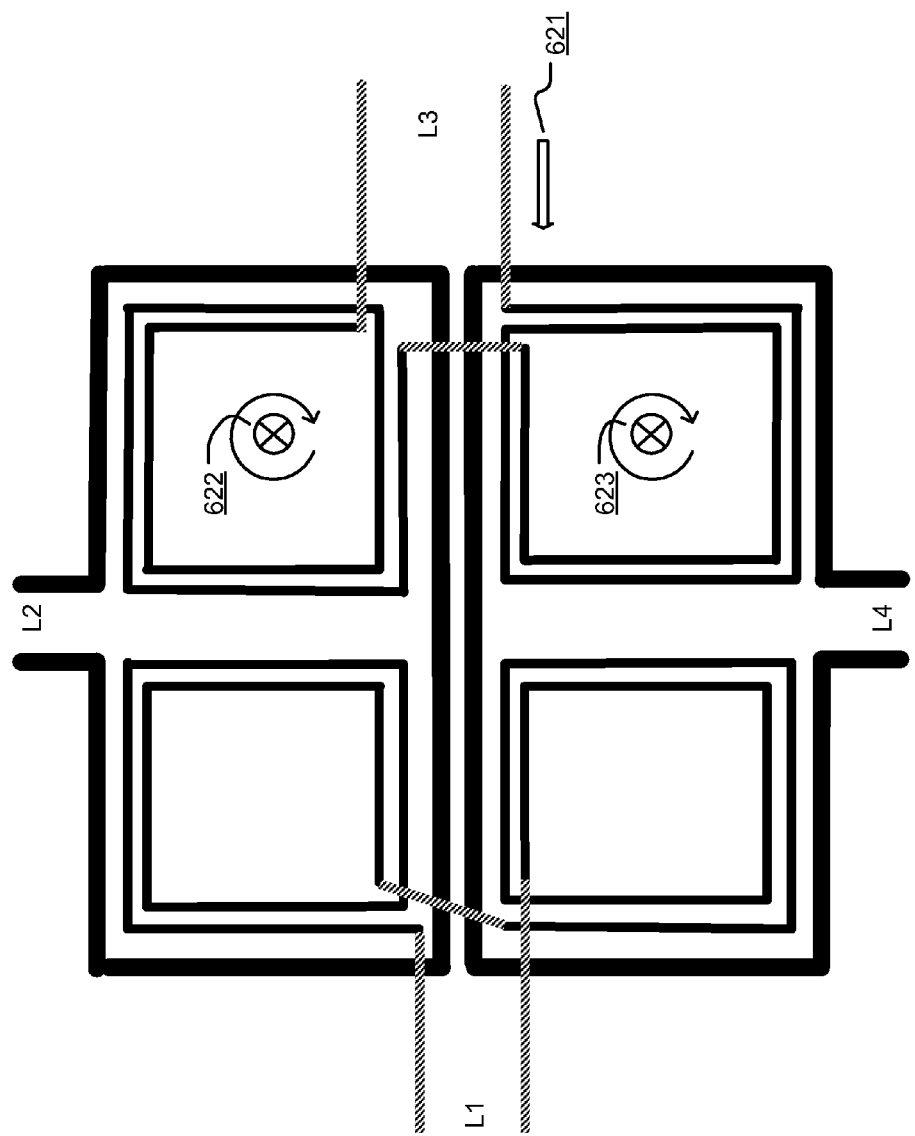

FIG. 6E illustrates the magnetic flux generated by inductor L3, according to an embodiment. For inductor L3, the flux lines generated in adjacent inductors L2 and L4 by a current 621 flowing through the inductor L3 at some given instant in time are oriented in a common direction. For example, when a current 621 flows through inductor L3, it generates a magnetic flux 622 through a portion of inductor L2 and a magnetic flux 623 through a portion of inductor L4 that are oriented in a common direction (i.e., into the page).

Figure 7:
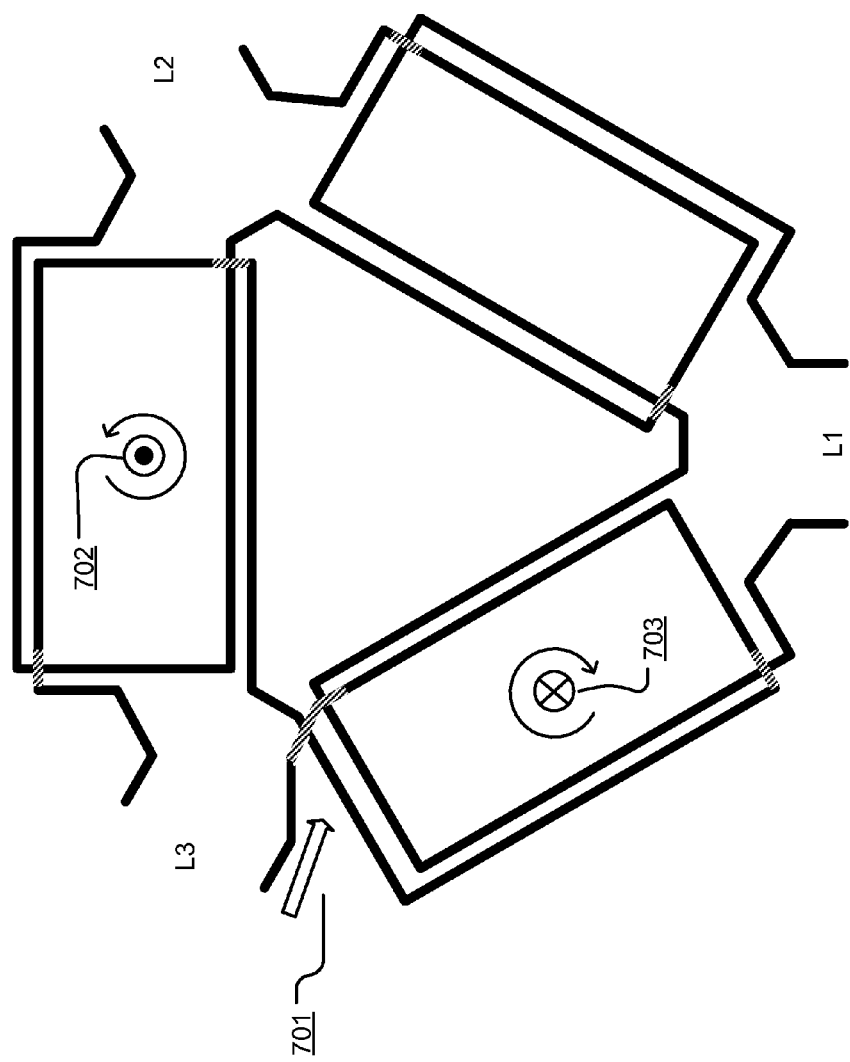
FIG. 7 illustrates a structure of magnetically-coupled inductors for a multi-phase oscillator having three oscillators, according to another embodiment.

FIG. 7 illustrates the structure of inductors for a multi-phase oscillator that has only three oscillators, according to another embodiment. As shown, the structure includes three inductors L1, L2, and L3, each of which corresponds to one of the three oscillators of the multi-phase oscillator. Inductors L1 and L2 are partially overlapping and magnetically coupled to each other. Inductors L2 and L3 are partially overlapping and magnetically coupled to each other. Inductors L1 and L3 are also partially overlapping and magnetically coupled to each other.

Inductor L1 is configured with two coils that carry current in the same circular directions. Thus, when a current (not shown) passes through inductor L1, it generates a magnetic flux through inductor L2 and a magnetic flux through L3 that are oriented in the same direction. Inductor L2 is configured with two coils that carry current in the same circular directions. Thus, when a current (not shown) passes through inductor L2, it generates a magnetic flux through inductor L1 and a magnetic flux through L3 that are oriented in a common direction (not shown).

Inductor L3 is configured with a forward coil and a reverse coil that carry current in opposite circular directions. Thus, when a current 701 passes through inductor L3, it generates a magnetic flux 703 through inductor L1 that is oriented in one direction (i.e., into the page) and a magnetic flux 702 through inductor L3 that is oriented in a substantially opposite direction. (i.e., out of the page). The configuration of inductors in FIG. 7 results in normal magnetic coupling between inductors L2-L3 and inductors L1-L2, but reverse magnetic coupling between inductors L1-L3 to cause a 180 degree phase shift in the coupling around the loop of oscillators.

Additionally, unlike the multi-phase oscillator in FIG. 4, a multi-phase oscillator that incorporates the magnetically coupled inductors in FIG. 7 only has a total of three oscillators. The multi-phase oscillator represented by FIG. 7 thus generates oscillation output signals that are 60 degrees out of phase with each other as opposed to 45 degrees out of phase with each other.

Figure 8:
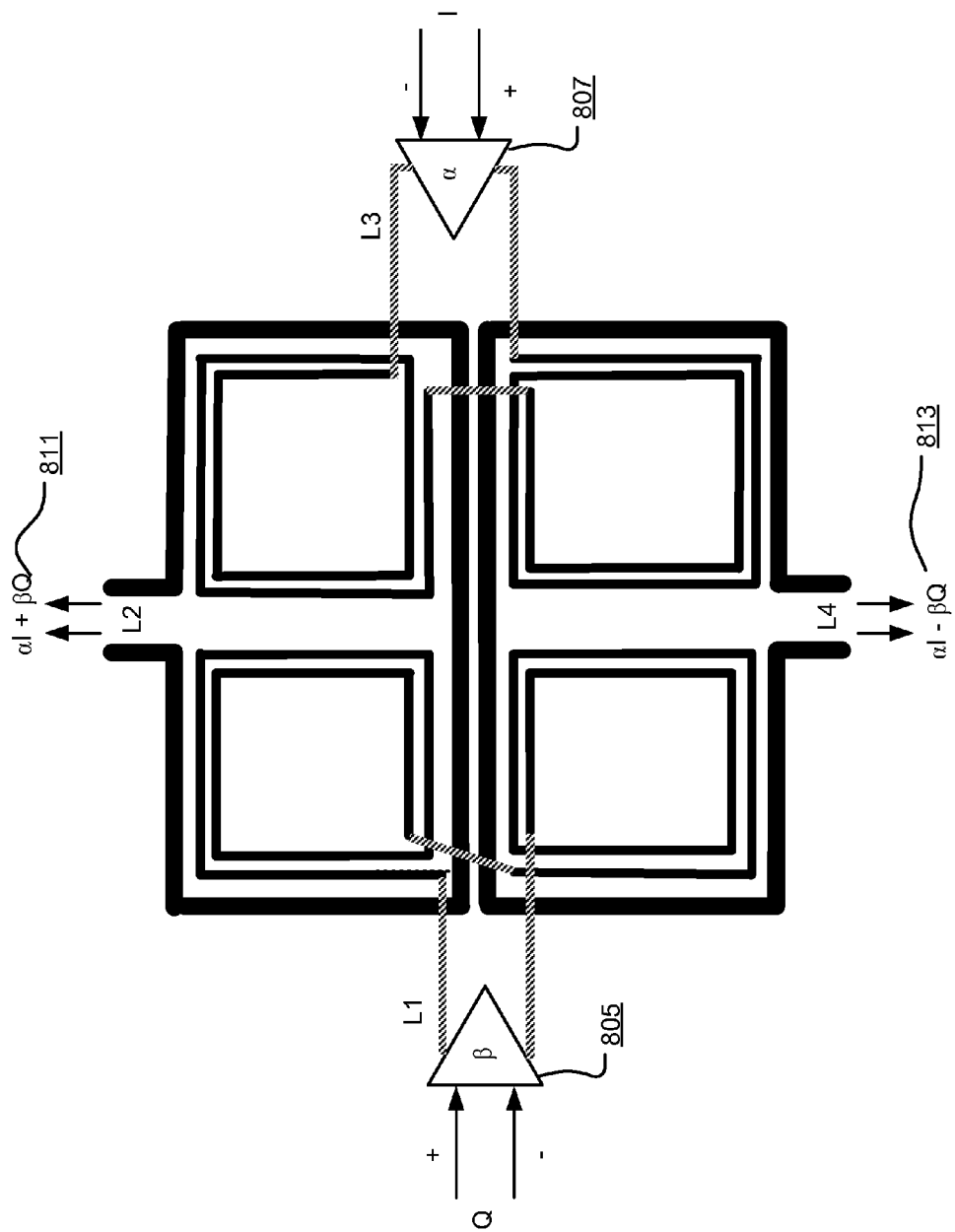
FIG. 8 illustrates a phase interpolator/mixer that uses the magnetically-coupled inductors of FIG. 6A, according to an embodiment.

FIG. 8 illustrates a phase interpolator/mixer that uses the inductive structure of FIG. 6A, according to yet another embodiment. The phase interpolator includes four inductors, L1, L2, L3 and L4 with overlapping coils. A gain circuit 805 receives a differential input signal Q, adjusts the amplitude of the signal by a factor of $\beta$, and applies the resulting signal to inductor L1. A gain circuit 807 receives a differential input signal I, adjusts the amplitude of the signal by a factor of $\alpha$, and applies the resulting signal to inductor L3. In one embodiment, I and Q are quadrature signals that are 90 degrees out of phase with each other.

Due to the magnetic coupling between inductors L1, L2, and L3, an output signal $\alpha I+\beta Q$ 811 is generated at the port of inductor L2. Output signal 811 represents the sum of the amplitude adjusted input signals I and Q. Due to the magnetic coupling between L1, L3, and L4, another output signal $\alpha I-\beta Q$ 813 is generated at the port of inductor L4. Because of the reverse coupling between inductors L1 and L4, output signal 813 represents the difference between the amplitude adjusted input signals I and Q.

Figure 9:
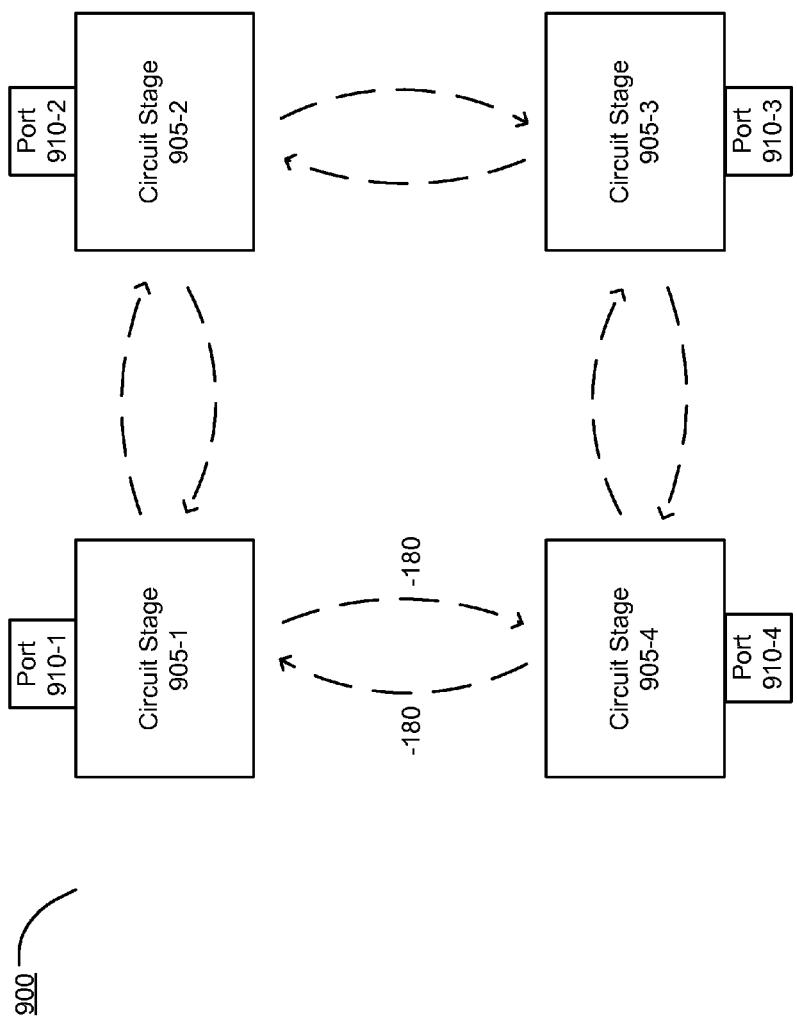
FIG. 9 illustrates a block diagram of coupled circuit stages, according to an embodiment.

FIG. 9 illustrates an apparatus 900 with four circuit stages 905, according to an embodiment. The four circuit stages 905 are coupled together as a loop or ring of circuit stages 905. Each circuit stage 905 includes an inductive element (not shown) that is magnetically coupled to the inductive element of its adjacent circuit stages 905 to form pairs of circuit stages. The magnetic coupling is reversed between circuit stage 905-1 and 905-4 to create a 180 degree phase inversion around the loop of circuit stages. The structure of the inductive elements and the coupling between the inductive elements may be similar to that shown in FIG. 6A. In other embodiments, there may be a different number of circuit stages 905, so long as there are three or more circuit stages 905 in the loop. Each circuit stage 905 also has a port 910 for receiving input signals or outputting output signals, depending on the embodiment.

In one embodiment, the apparatus 900 is a multi-phase oscillator. Each of the circuit stages 905 of the multi-phase oscillator may be similar to the oscillator stage 102 of FIG. 1A. Each port 910 may be an output port for outputting multi-phase signals. Each signal has substantially the same frequency as the other output signals but oscillates at different phases relative to the other signals as shown in FIG. 5.

In one embodiment, the apparatus 900 is a phase interpolator. In this embodiment, some of the circuit stages 905 may be input stages. For example, referring to both FIG. 8 and FIG. 9, circuit stage 905-1 may be an input stage that includes amplifier 805 and inductor L1. Circuit stage 905-3 may be an input stage that includes amplifier 807 and inductor L3. Some of the circuit stages may be output stages. For example, circuit stage 905-2 may be an output stage that includes inductor L2 and circuit stage 905-4 may be an output stage that includes inductor L4. Port 910-1 and 910-3 may be input ports that receive input signals, and ports 910-2 and 910-4 may be output ports for outputting output signals.

In this disclosure, a multi-phase oscillator and a phase interpolator have been provided as two examples of an apparatus that use the disclosed configuration of magnetically coupled inductors. Other apparatuses that use the disclosed configuration of magnetically coupled inductors may include, for example, a feed network for a phase array antenna. Some of these embodiments may be implemented, for example, as part of an integrated circuit device.

Upon reading this disclosure, those of skill in the art will appreciate still additional alternative designs for an apparatus that includes magnetically coupled inductors. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:
1. An apparatus, comprising:
   N circuit stages coupled in a loop, N>2, each of the N circuit stages having an inductive element that overlaps with inductive elements from two adjacent circuit stages in the loop, the overlapping inductive elements forming N pairs of inductively coupled elements, the N circuit stages including:

a first circuit stage having a first inductive element including a first coil and a second coil electrically connected to the first coil;

a second circuit stage having a second inductive element overlapping with the first coil of the first inductive element to form a first pair of inductively coupled elements, wherein a magnetic flux induced in the first coil of the first inductive element by a current through the first inductive element is oriented in a first direction at a given time, and a third circuit stage having a third inductive element overlapping with the second coil of the first inductive element to form a second pair of inductively coupled elements, wherein a magnetic flux induced in the second coil of the first inductive element by the current through the first inductive element is oriented in a second direction, substantially opposite to the first direction at the given time.

2. The apparatus of claim 1, wherein magnetic fluxes induced in remaining pairs of the N pairs of inductively coupled elements are oriented in the first direction.

3. The apparatus of claim 1, further comprising a plurality of output ports, each output port associated with a corresponding one of the N circuit stages, wherein each output port outputs at least one output signal having substantially the same frequency and each output signal has a phase difference from at least one output signal of an adjacent circuit stage.

4. The apparatus of claim 3, wherein the phase difference is substantially equal to 180 degrees divided by N (180°/N).

5. The apparatus of claim 3, wherein at least two of the output signals have a quadrature phase relationship.

6. The apparatus of claim 1, wherein the inductive element for each circuit stage forms part of an LC tank for the circuit stage, and each of the N circuit stages further comprises an energy injecting component for injecting energy into the LC tank.

7. The apparatus of claim 1, further comprising:
a first port associated with the first circuit stage and receiving a first input signal, wherein the magnetic fluxes are induced the first and second pairs of inductively coupled elements based on the input signal; and
a second port associated with a fourth second circuit stage and receiving a second input signal,
wherein the third circuit stage generates a first output signal indicative of a sum of the input signals,
wherein the second circuit stage generates a second output signal indicative of a difference between the input signals.

8. The apparatus of claim 7, wherein:
the first circuit stage includes a first amplifier that amplifies the first input signal;
the fourth circuit stage includes a second amplifier that amplifies the second input signal;
wherein the first output signal is indicative of a sum of the amplified input signals; and
wherein the second output signal is indicative of a difference between the amplified input signals.

9. The apparatus of claim 1, wherein the apparatus comprises four circuit stages.

10. The apparatus of claim 1, wherein the apparatus is an integrated circuit.

11. The apparatus of claim 1, wherein the inductive elements are formed in one or more metal layers on a substrate.

12. The apparatus of claim 1, wherein the inductive elements are formed in one or more metal layers of a printed circuit board.

13. A multi-phase oscillator comprising:
N oscillator stages coupled as a loop of oscillator stages, N>2, each oscillator stage comprising a LC tank and an energy injection component for injecting energy into the LC tank, wherein each LC tank comprises an inductive element that overlaps with inductive elements of LC tanks from two adjacent oscillator stages in the loop; and
a plurality of output ports, each output port associated with a corresponding one of the N oscillator stages, wherein each output port outputs at least one output signal having substantially the same frequency and each output signal has a phase difference from at least one output signal of an adjacent oscillator stage, the phase difference being substantially equal to 180 degrees divided by N (180°/N).

14. The oscillator of claim 13, wherein each LC tank oscillates at substantially the same frequency and each LC tank has a phase difference from the LC tank of an adjacent oscillator stage.

15. The oscillator of claim 13, wherein at least two of the output signals have a quadrature phase relationship.

16. A phase interpolator, comprising:
N circuit stages coupled as a loop of circuit stages, each circuit stage comprising an inductive element that overlaps with inductive elements of two adjacent oscillator stages in the loop, the N circuit stages including a first, second, third, and fourth circuit stages;
a first port associated with a first circuit stage for receiving a first input signal;
a second port associated with a second circuit stage for receiving a second input signal;
wherein a third circuit stage generates an first output signal indicative of a sum of the input signals; and
wherein fourth circuit stage generates a second output signal indicative of a difference between the input signals.

17. The phase interpolator of claim 16, wherein:
the first circuit stage comprises a first amplifier that amplifies the first input signal; and
the second circuit stage comprises a second amplifier that amplifies the second input signal;
wherein the first output signal is indicative of a sum of the amplified input signals, and
wherein the second output signal is indicative of a difference between the amplified input signals.

18. The phase interpolator of claim 16, wherein the inductive elements are formed in one or more metal layers on a substrate or formed in one or more metal layers of a printed circuit board.

* * * * *